(12) United States Patent
Taniguchi et al.

(10) Patent No.: US 12,368,987 B2
(45) Date of Patent: Jul. 22, 2025

(54) ELECTRONIC COMPONENT-EQUIPPED RESIN CASING AND METHOD FOR PRODUCING SAME

(71) Applicant: NISSHA CO.,LTD., Kyoto (JP)

(72) Inventors: Chuzo Taniguchi, Kyoto (JP); Jun Sasaki, Kyoto (JP); Eiji Kawashima, Kyoto (JP); Yasuisa Takinishi, Kyoto (JP)

(73) Assignee: Nissha Co., Ltd., Kyoto (JP)

( * ) Notice: Subject to any disclaimer, the term of this patent is extended or adjusted under 35 U.S.C. 154(b) by 245 days.

(21) Appl. No.: 18/265,572

(22) PCT Filed: Nov. 9, 2021

(86) PCT No.: PCT/JP2021/041109
§ 371 (c)(1),
(2) Date: Jun. 6, 2023

(87) PCT Pub. No.: WO2022/123981
PCT Pub. Date: Jun. 16, 2022

(65) Prior Publication Data
US 2024/0031713 A1     Jan. 25, 2024

(30) Foreign Application Priority Data

Dec. 7, 2020    (JP) ................................. 2020-202467

(51) Int. Cl.
*H01L 23/28*      (2006.01)
*B29C 45/14*      (2006.01)
(Continued)

(52) U.S. Cl.
CPC ............. *H04R 1/025* (2013.01); *H04R 1/028* (2013.01); *B29C 45/14639* (2013.01);
(Continued)

(58) Field of Classification Search
None
See application file for complete search history.

(56) References Cited

U.S. PATENT DOCUMENTS

| | | | |
|---|---|---|---|
| 10,383,232 B2* | 8/2019 | Heikkinen | H05K 1/0298 |
| 2010/0208920 A1* | 8/2010 | Lee | H05K 5/065 |
| | | | 361/752 |

FOREIGN PATENT DOCUMENTS

| | | |
|---|---|---|
| CN | 207764571 U | 8/2018 |
| EP | 1158375 A1 | 11/2001 |
| | (Continued) | |

OTHER PUBLICATIONS

International search report PCT/JP2021/41109 dated Jan. 11, 2022 (pp. 1-3).

*Primary Examiner* — Timothy J Thompson
*Assistant Examiner* — Amol H Patel
(74) *Attorney, Agent, or Firm* — Millen, White, Zelano & Branigan P.C.; William F. Nixon

(57) ABSTRACT

A resin housing having an electronic component and a method for manufacturing the same are disclosed. The resin housing includes an electronic component mounting film that includes a housing made of resin, a base film disposed along an inner surface of the housing, a circuit pattern layer formed on at least a surface opposite to a side of the housing of the base film, and an electronic component connected to the circuit pattern layer and mounted on a surface opposite to the side of the housing of the base film. The electronic component mounting film is integrated with the housing. An impact absorbing layer covers the electronic component of the electronic component mounting film and a periphery of the electronic component. The circuit pattern layer of the electronic component mounting film is not bent around a portion on which the electronic component is mounted.

18 Claims, 13 Drawing Sheets

(51) Int. Cl.
*H04R 1/02* (2006.01)
*H05K 3/28* (2006.01)
*B29L 31/34* (2006.01)

(52) U.S. Cl.
CPC ... *B29L 2031/3425* (2013.01); *H04R 2201/02* (2013.01); *H04R 2499/11* (2013.01); *H04R 2499/15* (2013.01)

(56) References Cited

FOREIGN PATENT DOCUMENTS

| | | | |
|---|---|---|---|
| JP | 2000164803 | A | 6/2000 |
| JP | 2006196865 | A | 7/2006 |
| JP | 2012134272 | A | 7/2012 |
| JP | 2018524799 | A | 8/2018 |

\* cited by examiner

ELECTRONIC COMPONENT-EQUIPPED RESIN CASING AND METHOD FOR PRODUCING SAME

TECHNICAL FIELD

The present invention relates to a resin housing having an electronic component and a method for manufacturing the same that downsize and thin an electrical product and facilitate assembly.

BACKGROUND ART

In an electrical product, various electronic components are mounted on a substrate and incorporated into a housing of the electrical product. For example, FIG. 9 is a partially enlarged cross-sectional view illustrating an example of arrangement of a housing and an electronic component of the related art. The electrical product illustrated in FIG. 9 is a smartwatch, and incorporates a speaker 53 as the electronic component. An electronic component mounting substrate 55 is fixed inside a housing 50 made of resin to be away from the housing 50. In the electronic component mounting substrate 55, a circuit pattern layer 52 is formed by patterning a copper foil or the like on a surface on the side of the housing 50 of a substrate 51 made of glass epoxy or the like, and the speaker 53 is electrically connected to the circuit pattern layer 52. Additionally, a speaker hole 50H is provided in a portion overlapping with the speaker 53 of the housing 50. Further, a mesh member 54 for protecting the speaker 53 from dust and dirt is bonded to an inner surface 50a of the housing 50 with an adhesive 56.

SUMMARY OF INVENTION

Technical Problem

However, needs for downsizing and thinning an electrical product always exist, and it is desired to further reduce an accommodation space for accommodating an electronic component. In addition, during assembling the electrical product, a process, such as tightening with screws that fixes an electronic component mounting substrate to an inside of a housing, is complicated. Further, in the case of an electronic component directly acting on an external space of a product (for example, the above-described speaker), it is also desired to bring the electronic component as close as possible to the housing to reduce a distance between the electronic component and the outer surface of the housing to enhance the functional effect.

An object of the present invention to solve the above-described problems is to downsize and thin an electrical product and to facilitate assembly.

Solution to Problem

Some aspects will be described below as means to solve the problems. These aspects can be combined randomly as necessary.

A resin housing having an electronic component of the present invention includes a housing, an electronic component mounting film, and an impact absorbing layer. The housing is made of resin. The electronic component mounting film includes a base film, a circuit pattern layer, and an electronic component. The base film is disposed along an inner surface of the housing. The circuit pattern layer is formed on at least a surface opposite to a side of the housing of the base film. The electronic component is connected to the circuit pattern layer and mounted on a surface opposite to the side of the housing of the base film. The electronic component mounting film is integrated with the housing. An impact absorbing layer covers the electronic component of the electronic component mounting film and a periphery of the electronic component. The circuit pattern layer of the electronic component mounting film is not bent around a portion on which the electronic component is mounted.

In the resin housing having the electronic component having such a configuration, the electronic component mounting film is integrated along the inner surface of the housing. Accordingly, since the electronic component can be firmly fixed by the housing, a substrate is not required separately, and an accommodation space for accommodating the electronic component becomes small. Therefore, the electrical product can be downsized and thinned. In addition, since a complicated process, such as tightening with screws, is not required, assembly is easy. In addition, a distance between the electronic component and an outer surface of the housing can be reduced to enhance a functional effect of the electronic component directly acting on an external space of the electrical product.

In addition, in the resin housing having the electronic component, the electronic component is connected to the circuit pattern layer and mounted on the surface opposite to the side of the housing of the base film. Additionally, the base film of the electronic component mounting film is not bent around the portion on which the electronic component is mounted. That is, the electronic component is not buried in the housing. As a result, during integral molding of the housing having the electronic component mounting film, the electronic component does not receive heat pressure of a molten resin from a side surface direction, and it is possible to prevent the electronic component from being displaced or damaged. In addition, since the circuit pattern layer provided on the base film of the electronic component mounting film is not bent along the side surface of the electronic component, disconnection of the circuit pattern layer can be suppressed. In addition, since the electronic component is not buried in the housing, repair of the electronic component is easy.

Further, in the resin housing having the electronic component, the impact absorbing layer covers the electronic component of the electronic component mounting film and the periphery of the electronic component. Thus, since a gap between a pocket of a mold for accommodating the electronic component and the electronic component can be eliminated during integral molding of the housing having the electronic component mounting film, the base film or the circuit pattern layer of the electronic component mounting film is not bent due to the gap. That is, disconnection of the circuit pattern layer can be suppressed.

A method for manufacturing a resin housing having an electronic component of the present invention includes: preparing an electronic component mounting film; setting the electronic component mounting film in a first mold; clamping the first mold and a second mold to form a cavity; and injecting a molten resin into the cavity to mold a housing and integrating the electronic component mounting film along an inner surface of the housing. The electronic component mounting film includes a base film, a circuit pattern layer formed on at least one surface of the base film, and an electronic component connected to the circuit pattern layer and mounted on the base film. In the electronic component mounting film, during setting in the first mold, the surface on which the electronic component is mounted faces the first mold. The first mold has a pocket. The pocket of the first mold is filled with the electronic component together with the impact absorbing layer that covers the electronic component and the periphery of the electronic component when the electronic component mounting film is set. The cavity is formed between the first mold with the electronic component mounting film and the second mold. During integral molding, the base film of the electronic component mounting film is not bent around the portion on which the electronic component is mounted.

In the method for manufacturing the resin housing having the electronic component having such a configuration, the electronic component mounting film is integrated along the inner surface of the housing. Accordingly, since the electronic component can be firmly fixed by the housing, a substrate is not required separately, and an accommodation space for accommodating the electronic component becomes small. Therefore, the electrical product can be downsized and thinned. In addition, since a complicated process, such as tightening with screws, is not required, assembly is easy. In addition, a distance between the electronic component and an outer surface of the housing can be reduced to enhance an effect of the electronic component directly acting on an external space of the electrical product.

The resin housing having the electronic component is integrally molded in a state where the electronic component is accommodated in the pocket of the first mold. As a result, the electronic component does not receive the heat pressure of the molten resin from the side surface direction, and it is possible to prevent the electronic component from being displaced or damaged. In addition, since the circuit pattern layer provided on the base film of the electronic component mounting film is not bent along the side surface of the electronic component, disconnection of the circuit pattern layer can be suppressed. In addition, since the electronic component is not buried in the housing, repair of the electronic component is easy.

Further, in the resin housing having the electronic component, the impact absorbing layer covers the electronic component of the electronic component mounting film and the periphery of the electronic component. Thus, since a gap between a pocket of a mold for accommodating the electronic component and the electronic component can be eliminated during integral molding of the housing having the electronic component mounting film, the base film or the circuit pattern layer of the electronic component mounting film is not bent due to the gap. That is, disconnection of the circuit pattern layer can be suppressed.

After the electronic component of the electronic component mounting film and the periphery of the electronic component are covered with the impact absorbing layer, the electronic component mounting film can be set in the first mold, or after the impact absorbing layer is provided in the pocket of the first mold in advance, the electronic component mounting film may be set in the first mold. Further, the impact absorbing layer may be provided in the pocket of the first mold simultaneously with setting the electronic component mounting film in the first mold.

In each of the configurations, the impact absorbing layer may be made of a material having properties of a heat-resistant temperature of 80° C. or higher and a rebound resilience indicative of a cushioning property from 15 to 70%. The material having the properties may be any one of a soft polyurethane foam, a silicone resin, and a urethane rubber.

In each of the configurations, the impact absorbing layer may be made of any one of a polyolefin-based hot melt, a polyurethane-based hot melt, and a polyamide-based hot melt.

Advantageous Effects of Invention

The resin housing having the electronic component of the present invention can downsize and thin the electrical product and facilitate assembly.

DESCRIPTION OF EMBODIMENTS

First Embodiment

A resin housing having an electronic component and a method for manufacturing the same according to the first embodiment of the present invention will be described below with reference to the drawings.

Figure 1:
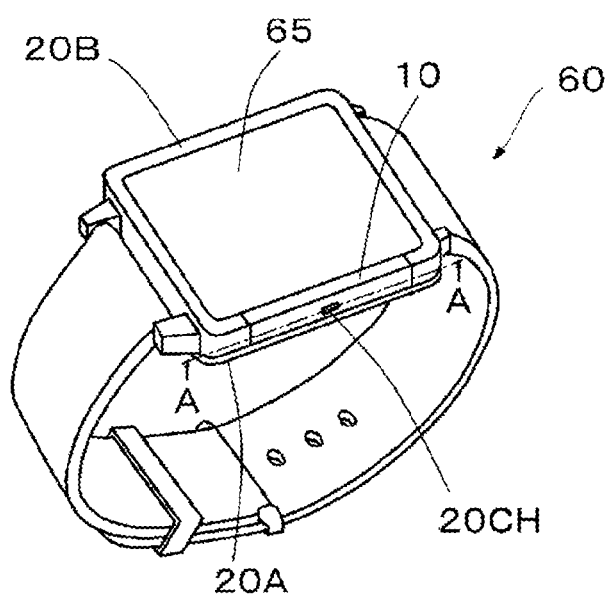
FIG. 1 is a perspective view illustrating an example of a smartwatch to which a resin housing having an electronic component according to a first embodiment is applied.

FIG. 1 is a perspective view illustrating an example of a smartwatch to which the resin housing having the electronic component according to the first embodiment of the present invention is mounted. Needs for downsizing and thinning always exist for a smartwatch 60 equipped with a large screen illustrated in FIG. 1, and the smartwatch 60 is suitable for an electrical product to which the present invention is applied. Although the smartwatch 60 is an example of the electrical product to which the present invention is applied in the present embodiment, the electrical product to which the present invention is applied is not limited to the smartwatch 60.

A body of the smartwatch 60 includes a housing disposed so as to cover a surface opposite to a display surface of a display panel 65 and side surfaces thereof. In the example illustrated in FIG. 1, three housings of a housing 20A constituting a bottom surface portion, a housing 20B constituting a C-shaped frame, and a resin housing having an electronic component 10, which is provided between both ends of the housing 20B to constitute a frame and includes a speaker, are combined. Among them, the resin housing having the electronic component 10 provided with the speaker is the resin housing having the electronic component according to the first embodiment of the present invention.

(1) OUTLINE OF RESIN HOUSING HAVING ELECTRONIC COMPONENT 10

Figure 2:
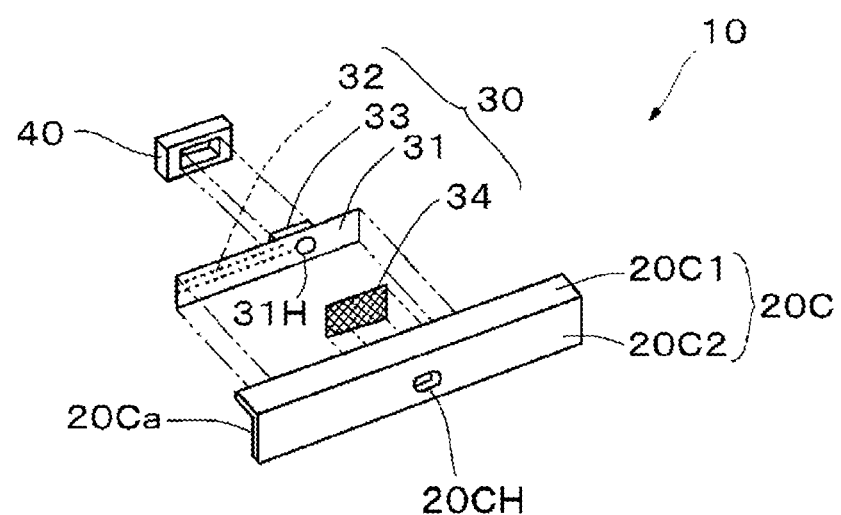
FIG. 2 is an exploded perspective view of the resin housing having the electronic component according to the first embodiment.
Figure 3:
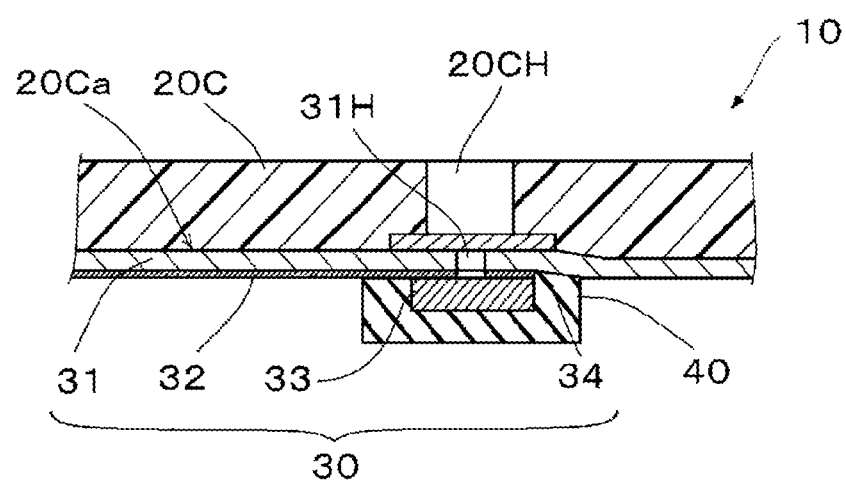
FIG. 3 is a partially enlarged cross-sectional view of the resin housing having the electronic component according to the first embodiment (cross-section taken along the line A-A in FIG. 1).

The resin housing having the electronic component 10 is molded by insert molding. As illustrated in FIGS. 2 and 3, the resin housing having the electronic component 10 is a component of the smartwatch 60 in while a housing 20C made of thermoplastic resin, an electronic component mounting film 30, and an impact absorbing layer 40 are completely integrated.

(2) HOUSING 20C

The housing 20C is a molded article made of resin having an L-shaped cross section and including an elongated upper surface portion 20C1 and an elongated side surface portion 20C2. The side surface portion 20C2 has a speaker hole 20CH penetrating near the center in the longitudinal direction.

As the material of the housing 20C, a general-purpose thermoplastic resin, such as a polystyrene-based resin, a polyolefin-based resin, an ABS resin, or an AS resin, is preferably used. Besides, a polycarbonate-based resin, a polyacetal resin, an acrylic-based resin, a polybutylene terephthalate resin, an engineering resin (for example, a polysulfone resin, a polyphenylene sulfide-based resin, a polyphenylene oxide-based resin, and a polyarylate-based resin), a polyamide-based resin, or a urethane-based, polyester-based, or styrene-based elastomer can be used as the material of a molded body 21. Furthermore, natural rubber and synthetic rubber can be used as the material of the molded body 21. A reinforcing material, such as glass fiber or inorganic filler, can be added to the housing 20C.

The housing 20C may be colored, or the outer surface of the housing 20C may be covered with a decorative layer. Alternatively, both of them may be employed.

(3) ELECTRONIC COMPONENT MOUNTING FILM 30

FIGS. 2 and 3 illustrate the structure of the electronic component mounting film 30.

The electronic component mounting film 30 includes a base film 31, a circuit pattern layer 32, a speaker 33 (an example of the electronic component), and a mesh member 34.

(3-1) Base Film 31

The base film 31 is disposed on a side of an inner surface 20Ca along the side surface portion 20C2 of the housing 20C.

Although the speaker hole 20CH is provided in the side surface portion 20C2 of the housing 20C on which the base film 31 is disposed, the mesh member 34 is interposed between the base film 31 and the speaker hole 20CH of the housing 20C, and thus the base film 31 is not exposed from the speaker hole 20CH. Therefore, the base film 31 may be transparent or opaque.

The material of the base film 31 is selected from, for example, a resin film made of a polyester resin, a polyethylene terephthalate (PET) resin, an acrylic resin, a polycarbonate resin, a polybutylene terephthalate (PBT) resin, a triacetyl cellulose resin, a polyimide resin, a liquid crystal polymer, an urethane resin, a silicone resin, a styrene resin, or an ABS resin, a multilayer film made of an acrylic resin and an ABS resin, or a multilayer film made of an acrylic resin and a polycarbonate resin. The thickness of the base film 31 is selected from a range, for example, from 15 μm to 400 μm. Since it has a thickness likely to be flexible, the position is not stable simply by disposing it inside the housing 20C in this state. By integrating the electronic component mounting film 30 with the housing 20C, an electronic component 33 can be firmly fixed.

(3-2) Circuit Pattern Layer 32

The circuit pattern layer 32 is formed on a surface opposite to the side of the housing 20C of the base film 31.

The circuit pattern layer 32 is formed by etching a copper foil or formed by printing conductive ink by thick film printing. The thickness of the circuit pattern layer 32 is, for example, from 1 μm to 30 μm. The conductive ink contains a conductive filler and a binder. As the conductive filler, for example, powder of a conductive material or conductive powder obtained by plating surfaces of non-conductive particles with a metal can be used. Examples of the conductive material include gold, silver, copper, aluminum, nickel, carbon, and graphite. Example of the conductive powder plated with the metal includes conductive powder obtained by plating surfaces of urethane particles or silica particles with copper, nickel, or silver. A thermoplastic resin, such as a polyester-based resin, an acrylic-based resin, a vinyl chloride-vinyl acetate copolymer resin, a vinyl chloride-vinyl acetate-maleic acid copolymer resin, or a thermoplastic urethane resin blended with a tackifier, which develops adhesiveness by heat of, for example, a rosin-based resin, a rosin ester-based resin, or a petroleum resin, can be used as the binder. A solvent used in the ink is, for example, one suitable for thick film printing. The thick film printing includes, for example, screen printing and inkjet printing. As the binder, in addition to the thermoplastic resin, for example, use of an epoxy-based, urethane-based, or acrylic-based thermosetting resin or an ultraviolet-curable resin is possible. Since the circuit pattern layer 32 is formed of the materials and the thickness as described above, disconnection is likely to occur when the circuit pattern layer 32 is bent.

(3-3) Speaker 33

The speaker 33 is connected to the circuit pattern layer 32 and mounted on the surface opposite to the side of the housing 20C of the base film 31.

A sound wave generation direction of the speaker 33 is the side of the housing Therefore, the base film 31 is provided with a through-hole 31H so as to easily transmit a sound wave from the speaker 33 at the back.

As the speaker 33, a small and thin speaker mounted on a mobile device or the like is used. The speaker 33 is mounted by soldering, application and curing of a conductive adhesive paste, or pressure bonding with anisotropic conductive paste.

(3-4) Mesh Member 34

The mesh member 34 is a sheet bonded to the surface on the side of the housing of the base film 31, that is, opposite to the surface on which the speaker 33 is mounted so as to cover at least the through-hole 31H of the base film 31. In addition, it is disposed so as to cover the speaker hole 20CH of the housing 20C from the viewpoint of appearance.

The mesh member 34 suppresses entrance of dust and dirt to the speaker 33 of the smartwatch 60 through a speaker hole 20CH and the through-hole 31H.

As examples of the material of the mesh member 34, in addition to metal, such as nickel, copper, iron, aluminum, and titanium, and an alloy thereof (for example, monel, steel, yellow brass, red brass, phosphor bronze, Hastelloy (trademark of Haynes International in the United States of America), Inconel (trademark of Specialty Metals), such as nichrome), a resin, such as an acrylic resin, nylon (trademark of Du Pont), polyester, polypropylene, polyethylene, and Teflon (registered trademark of Du Pont) can be used. The mesh member 34 may be a woven fabric. A shape and an array of holes of the mesh member 34 are not limited as long as the holes do not unnecessarily block sound waves. For example, holes having a polygonal shape, such as a plurality of quadrangular shapes, and circular shapes may be arrayed, or the holes may be a plurality of slit-like holes. Further, water repellent treatment may be provided for waterproofing.

(4) IMPACT ABSORBING LAYER 40

The impact absorbing layer 40 is disposed so as to cover the speaker 33 of the electronic component mounting film 30 and the periphery of the speaker 33.

The impact absorbing layer 40 itself changes the shape such that the circuit pattern layer 32 of the electronic component mounting film 30 can maintain a non-bending state around the portion where the electronic component is mounted in the manufacturing process of integrating the housing 20C and the electronic component mounting film 30 described later.

As the material of the impact absorbing layer 40, for example, 1) a material having excellent heat resistance and cushioning property and 2) a hot melt material can be used.

1) The material having excellent heat resistance and cushioning property is a material having properties of a heat-resistant temperature of 80° C. or higher and rebound resilience, which indicates a cushioning property, from 15 to 70%. When the heat-resistant temperature of the material is less than 80° C., the material cannot withstand a mold temperature during insert molding and loses the cushioning property. When the rebound resilience exceeds 70%, compression deformation cannot be performed such that an electronic component 33 is accommodated in a pocket 110. When the rebound resilience is less than 15%, the electronic component 33 cannot be supported such that the base film 31 does not bend. 1) The material preferably has repeated compression set indicative of a degree of fatigue of 20% or less.

As specific examples of the material having such a property, plastic foams, such as flexible polyurethane foams, rubbers, such as silicone resins and urethane rubbers, and various elastomers can be used. Examples of the elastomer include a urethane-based elastomer, a styrene-based elastomer, an acrylic-based elastomer, an ester-based elastomer, an olefin-based elastomer, a vinyl chloride-based elastomer, and an amide-based elastomer. Among them, flexible polyurethane foam, silicone resin, and urethane rubber are particularly preferred.

2) The hot melt material is a material that is a solid material at ordinary temperature containing a thermoplastic resin as a main component, is liquefied at a low melting point by heating, and is solidified by cooling. In the present invention, it is also a material that softens at a temperature of the molten resin during molten resin injection when the housing 20C is molded, and solidifies again at the mold temperature during cooling and solidification. Specifically, polyolefin-based, polyurethane-based, polyamide-based, and polyester-based materials can be used. Among them, polyolefin-based, polyurethane-based, and polyamide-based hot melts are particularly preferable.

(5) MANUFACTURING RESIN HOUSING HAVING ELECTRONIC COMPONENT 10

An example of a method for manufacturing the resin housing having the electronic component 10 will be described with reference to FIGS. 4 to 6.

Figure 4:
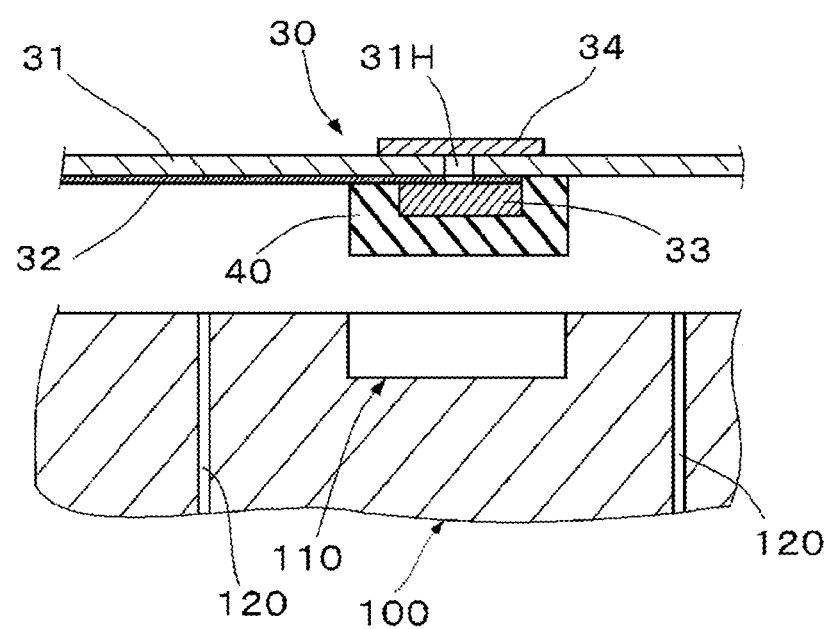
FIG. 4 is a partially enlarged cross-sectional view illustrating an example of a state before the electronic component mounting film is set in a first mold.

First, as illustrated in FIG. 4, the electronic component mounting film 30 is inserted between a first mold 100 and a second mold 200 (not illustrated) for molding the housing 20C in a state where the speaker 33 and the periphery of the speaker 33 are covered with the impact absorbing layer 40. At this time, the surface on which the speaker 33 is mounted of the electronic component mounting film 30 faces the first mold 100.

Figure 10:
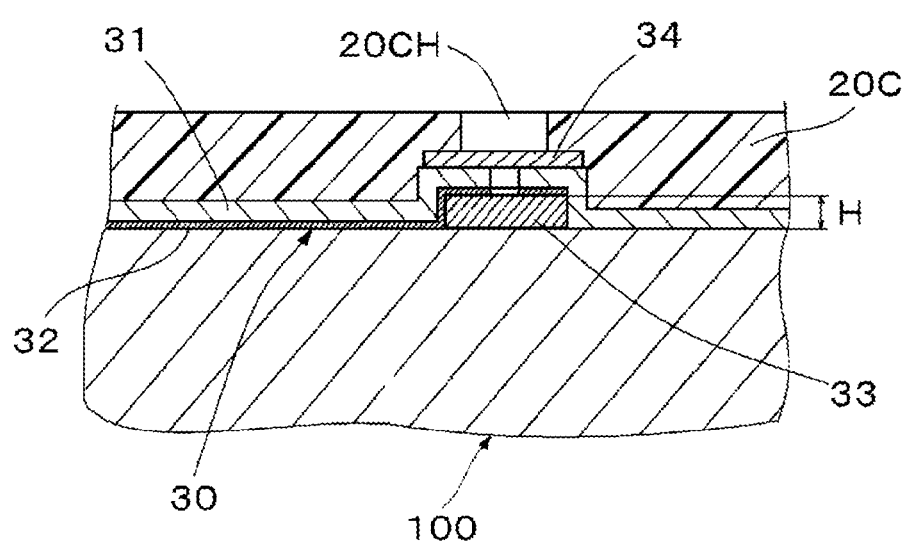
FIG. 10 is a partially enlarged cross-sectional view illustrating a case where there is no pocket for accommodating a speaker.

The first mold 100 is provided with the pocket 110 for accommodating the speaker 33. Thus, it is possible to avoid the speaker 33 to being buried in the housing 20C after molding. In a case where the first mold 100 has a smooth surface without the pocket 110, the surface opposite to the side of the base film 31 of the speaker 33 is formed to be flush with its periphery (see FIG. 10). That is, the speaker 33 is buried in the housing 20C. In this case, the speaker 33 possibly receives heat pressure of a molten resin 300 from a side surface direction and causes position displacement and damage of the speaker 33. As a countermeasure, it is conceivable to provide a cover for avoiding the heat pressure, but the function of the speaker 33 is hindered. In addition, since the base film 31 and the circuit pattern layer 32 of the electronic component mounting film 30 are bent by a thickness H of the speaker 33, the circuit pattern layer 32 may be disconnected. Further, when the speaker 33 is buried in the housing 20C, the speaker 33 cannot be repaired.

The size of the pocket 110 of the first mold 100 is formed to be larger than the size of the speaker 33 accommodated in the pocket 110. This is because when the dimensions of the pocket 110 are the same as that of the speaker 33, it is difficult to fit the speaker 33 into the pocket 110 and it is difficult to take out the speaker 33 from the pocket 110 after molding. When the pocket 110 is forcibly fitted or forcibly taken out while the dimensions of the pocket 110 are the same size as that of the speaker 33, the speaker 33 is possibly damaged. Further, one of the reasons why the size of the pocket 110 is made larger is that there is a slight mounting error occurs in the horizontal direction and the vertical direction in mounting the speaker 33 in the resin housing having the electronic component 10.

A plurality of suction holes 120 are provided on a surface facing the electronic component mounting film 30 of the first mold 100. Thus, the electronic component mounting film 30 can be sucked and fixed to the first mold 100 by vacuum suction.

On the other hand, as illustrated in FIG. 4, when the electronic component mounting film 30 is inserted between the first mold 100 and the second mold 200 (not illustrated), the speaker 33 and the periphery of the speaker 33 are covered with the impact absorbing layer 40.

In the case of the impact absorbing layer 40 made of 1) the material having excellent heat resistance and cushioning property, methods for forming the impact absorbing layer 40 on the electronic component mounting film 30 include a dispensing method and a method for bonding a product formed by block machining or molding. In the case of pasting a molded material, the molded material may have a sheet shape. In the case of the impact absorbing layer 40 made of 2) the hot melt material, examples of the method include a potting method, a method for bonding a sheet-like material, and a Low Pressure Molding (LPM) method. In particular, it is preferable to use the LPM, which is low in cost and excellent in productivity.

Figure 5:
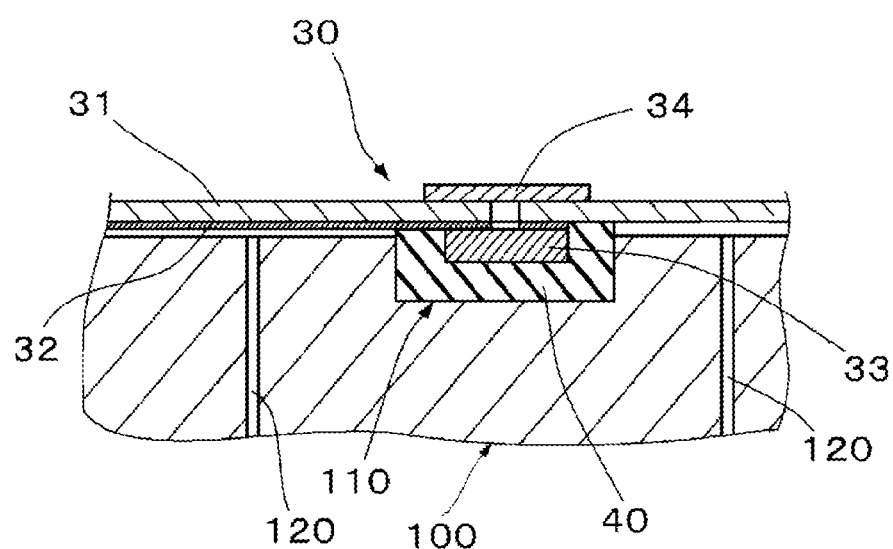
FIG. 5 is a partially enlarged cross-sectional view illustrating an example of a state in which the electronic component mounting film is set in the first mold.

Thereafter, as illustrated in FIG. 5, the electronic component mounting film 30 provided with the impact absorbing layer 40 is set in the first mold 100. At this time, the speaker 33 is accommodated in the pocket 110 so as to fill the pocket 110 of the first mold 100 together with the impact absorbing layer 40. That is, the inside of the pocket 110 is gapless.

In the example illustrated in FIG. 5, the portion of the electronic component mounting film 30 not covered with the impact absorbing layer 40 slightly floats from the first mold 100 due to the thickness of the impact absorbing layer 40, but may be in close contact with the first mold 100. In any case, when the impact absorbing layer 40 is made of the material having the cushioning property, the electronic component mounting film 30 is sucked and fixed before mold clamping by vacuum suction with the plurality of suction holes 120 provided in the surface facing the electronic component mounting film 30 of the first mold 100. Therefore, even when the electronic component mounting film 30 slightly floats from the first mold 100, the electronic component mounting film 30 is in close contact with the first mold 100 by compression of the impact absorbing layer 40. Also in the case where the impact absorbing layer 40 is made of the hot melt material, even when the electronic component mounting film 30 slightly floats from the first mold 100, due to softening of the impact absorbing layer 40 during injection of the molten resin 300 described later, the electronic component mounting film 30 is in close contact with the first mold 100 by compression of the impact absorbing layer 40.

Figure 6:
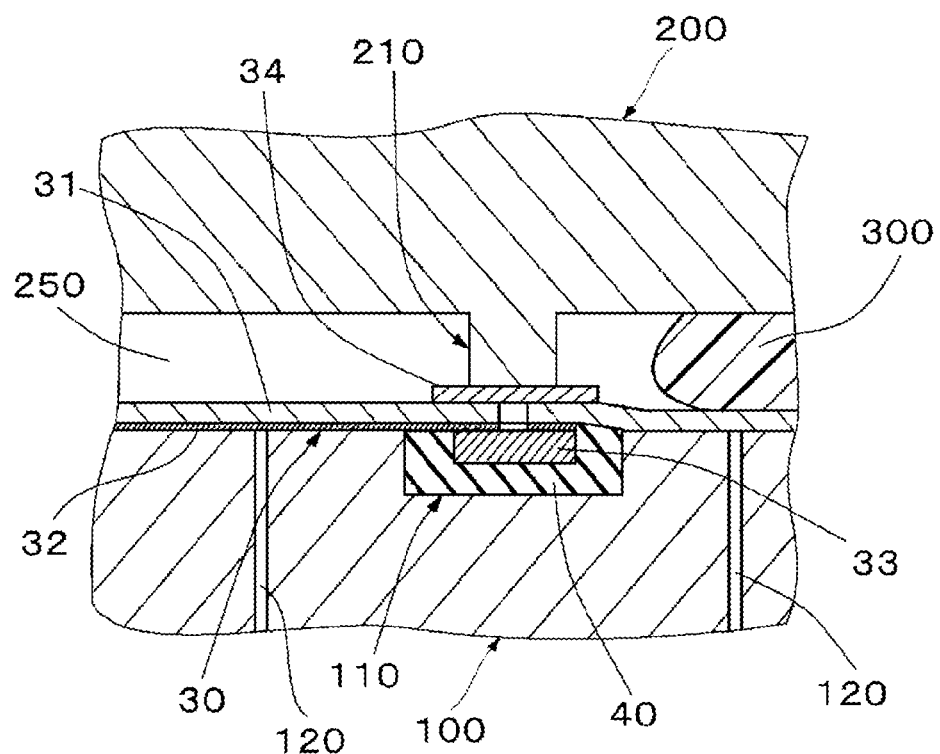
FIG. 6 is a partially enlarged cross-sectional view illustrating an example of a state in which molten resin is injected into a cavity.

FIG. 6 illustrates a state in which the first mold 100 and the second mold 200 are closed.

A cavity 250 is formed between the first mold 100, the electronic component mounting film 30, and the second mold 200. The second mold 200 is provided with a pin 210 that protrudes to face the mesh member 34 of the electronic component mounting film 30. The pin 210 is for forming the speaker hole 20CH of a housing 20C.

Since the impact absorbing layer 40 having the cushioning property is present in the pocket 110 of the first mold 100, the entire portion of the electronic component mounting film 30 covering the pocket 110 comes into contact with the distal end surface of the pin 210 in a parallel state at the mold clamping position of the pin 210 of the second mold. That is, the circuit pattern layer 32 of the electronic component mounting film 30 is in a non-bent state around the portion where the speaker 33 is mounted.

Figure 11:
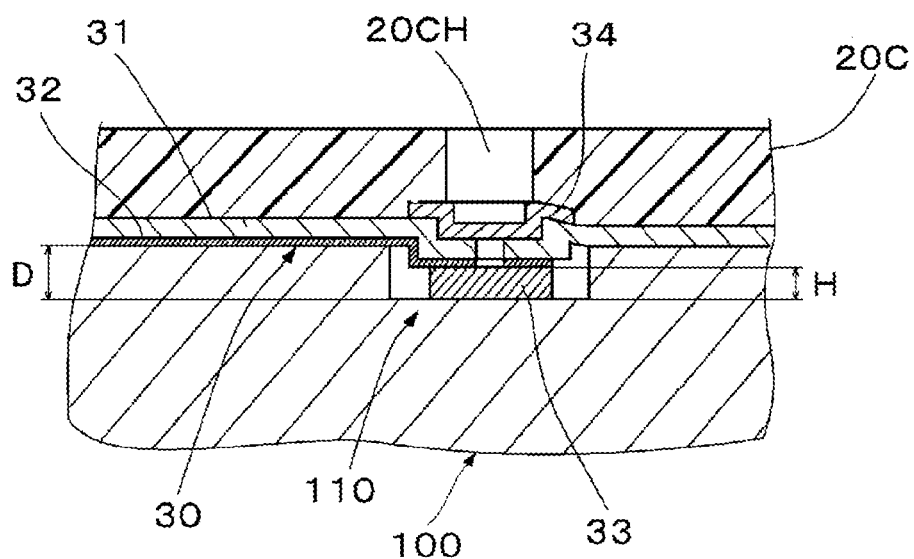
FIG. 11 is partially enlarged sectional view illustrating a case where an electronic component is accommodated in a pocket without providing an impact absorbing layer.

In a case where only the speaker 33 is accommodated in the pocket 110 of the first mold 100 and the impact absorbing layer 40 does not exist, molding is performed such that the surface opposite to the side of the base film 31 of the speaker 33 is in contact with the bottom surface of the pocket 110 (see FIG. 11). Therefore, when a mounting height H of the speaker 33<a depth D of the pocket 110 is met (see FIG. 11) due to the above-described mounting error, the base film 31 and the circuit pattern layer 32 of the electronic component mounting film 30 are bent by the difference between the mounting height H of the speaker 33 and the depth D of the pocket 110, which possibly causes disconnection of the circuit pattern layer 32.

As in the present invention, when the impact absorbing layer 40 having the cushioning property is provided so as to fill the pocket 110 of the first mold 100, the base film 31 and the circuit pattern layer 32 of the electronic component mounting film 30 are not bent as illustrated in FIG. 11, and the non-bent state can be maintained.

In a state where the circuit pattern layer 32 is not bent around the portion where the speaker 33 is mounted, as illustrated in FIG. 6, the molten resin 300 is injected into the cavity 250 to form the housing 20C. Then, when the molten resin 300 is cooled and solidified, the housing 20C molded by solidifying the molten resin 300 and the electronic component mounting film 30 are completely integrated. The material of the molten resin 300 is the same as the material of the housing 20C described above, and is injected in a molten state at a temperature of the melting point or higher.

Next, the first mold 100 and the second mold 200 are opened. For example, the resin housing having the electronic component 10 is removed from the second mold 200 using an ejector pin (not illustrated) protruding from the second mold 200, and is held and taken out by an approaching extraction robot (not illustrated).

(6) MODIFIED EXAMPLES

(6-1) Modified Example 1

In the first embodiment, the case where the circuit pattern layer 32 is formed only on the surface opposite to the side of the housing 20C of the base film 31 has been illustrated and described. However, the method for forming the circuit pattern layer 32 is not limited thereto. For example, the circuit pattern layers 32 may be formed on both surfaces of the base film 31.

Note that the circuit pattern layer 32 formed on the surface opposite to the side of the housing 20C of the base film 31 and electrically connected to the speaker 33 may be drawn to the surface on the side of the housing 20C of the base film 31 via a through hole. At this time, on the surface opposite to the side of the housing 20C of the base film 31, the circuit pattern layer 32 may be configured by only a land for mounting the speaker 33 in the shortest case.

(6-2) Modified Example 2

In the first embodiment, the case where the surface on the side of the housing 20C of the base film 31 of the electronic component mounting film 30 is directly integrated with the housing 20C has been illustrated and described, but the integration of the electronic component mounting film 30 with the housing 20C is not limited thereto. For example, an adhesive layer may be interposed between the electronic component mounting film 30 and the housing 20C.

For example, an adhesive or an adhesive film can be used as an adhesive layer. As the adhesive, an acrylic resin, a urethane resin, a polyester resin, a polyamide resin, an ethylene butyl alcohol resin, an ethylene vinyl acetate copolymer, a vinyl chloride-vinyl acetate copolymer, or the like can be used. As the method for forming the adhesive layer or the like, a typical printing method, such as an offset printing method, a gravure printing method, and a screen printing method, or a coating method, such as a gravure coating method, a roll coating method, or a comma coating method, can be used. Further, as the adhesive layer, an adhesive film can be laminated on the electronic component mounting film 30 for use. As the adhesive film, for example, an unstretched polypropylene film can be used and laminated by a dry lamination method.

(6-3) Modified Example 3

In the first embodiment, the case where the circuit pattern layer 32 formed on the surface opposite to the side of the housing 20C of the base film 31 is exposed in the electronic component mounting film 30 is illustrated and described, but the present invention is not limited thereto. For example, the circuit pattern layer 32 formed on the surface opposite to the side of the housing 20C of the base film 31 may be covered with a cover film except for at least a region necessary for mounting the speaker 33. The region necessary for mounting the speaker 33 may be the speaker 33 and the periphery of the speaker 33, or may be only the connection region with the speaker 33. In addition to the region necessary for mounting the speaker 33, for example, another terminal portion can also be exposed.

In Modified Example 3, the cover film is adhered to cover the circuit pattern layer 32 with an adhesive such that the circuit pattern layer 32 is not exposed to the outside except for a part of the circuit pattern layer 32. The cover film is made of polycarbonate, polyethylene terephthalate (PET), an acrylic film, or the like.

When the circuit pattern layers 32 are formed on both surfaces of the base film 31, the circuit pattern layer 32 on the side of the housing 20C may be covered with a cover film. Alternatively, both of the circuit pattern layers 32 formed on both surfaces may be covered with cover films.

When the circuit pattern layer 32 on the side of the housing 20C is covered with the cover film, it is preferable to provide the adhesive layer described in Modified Example 2 for firm integration with the housing 20C.

(6-4) Modified Example 4

In the first embodiment, the case where the housing 20C and the electronic component mounting film 30 are completely integrated has been described as an example, but the present invention is not limited thereto. For example, when the speaker 33 of the electronic component mounting film 30 is fixed at an accurate position with respect to the speaker hole 20CH of the housing 20C, a part of the electronic component mounting film 30 need not be integrated with the housing 20C.

As an example, a part of the electronic component mounting film 30 may include the circuit pattern layer 32 and be away from the inner surface 20Ca of the housing 20C to be free. That is, a part of the electronic component mounting film 30 can function as Flexible Printed Circuits (FPCs). In this case, at manufacturing the resin housing having the electronic component 10, a portion of the electronic component mounting film 30 that is free from the housing 20C is accommodated in the first mold 100.

(6-5) Modified Example 5

In the first embodiment, the case where the speaker 33 is mounted as the electronic component on the resin housing having the electronic component 10 has been described, but the electronic component to be mounted is not limited thereto. For example, a microphone may be mounted as the electronic component. In this case, the speaker hole 20CH of the housing 20C serves as a microphone hole. Further, an IR sensor or an LED may be mounted as the electronic component, or another electronic component may be mounted.

(6-6) Modified Example 6

In the first embodiment, the case where the speaker hole 20CH of the housing 20C and the mesh member 34 covering the speaker hole 20CH are provided in the resin housing having the electronic component 10 has been described. However, the present invention is not limited to the configuration including these members. When an electronic component other than the speaker 33 or the microphone is mounted, a path for transmitting sound waves is not necessary. For example, when the electronic component is an IR sensor or an LED, the surfaces may be completely covered with the light-transmissive housing 20C.

(6-7) Modified Example 7

In the first embodiment, the electrical product incorporating the resin housing having the electronic component 10 is the smartwatch 60, but the electrical product to which the present invention is applied is not limited to the smartwatch 60. For example, it may be any various home electrical products including smart glasses, a notebook computer, a tablet terminal, a smartphone, and a game machine, or an automobile interior product. Therefore, the shape of the housing 20C is not limited to the shape of the first embodiment.

Second Embodiment

Next, a method for manufacturing the resin housing having the electronic component according to the second embodiment of the present invention will be described with reference to FIGS. 7 and 8. The method for manufacturing the resin housing having the electronic component according to the second embodiment differs from the method for manufacturing the resin housing having the electronic component according to the first embodiment in that the impact absorbing layer 40 is disposed in the pocket 110 of the first mold 100 in advance.

Figure 7:
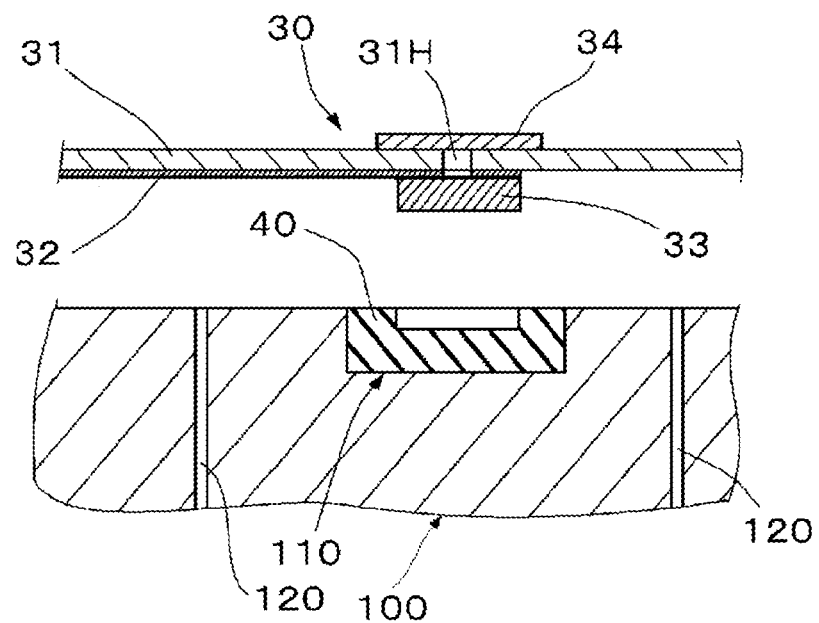
FIG. 7 is a partially enlarged cross-sectional view illustrating another example of a state before the electronic component mounting film is set in the first mold (second embodiment).

In the second embodiment, as illustrated in FIG. 7, when the electronic component mounting film 30 is inserted between the first mold 100 and the second mold 200 (not illustrated), the speaker 33 and the periphery of the speaker 33 are not covered with the impact absorbing layer 40, and the impact absorbing layer 40 is provided in the pocket 110 of the first mold 100 in advance.

In the case of the impact absorbing layer 40 made of 1) the material having excellent heat resistance and cushioning property, an example of the method for forming the impact absorbing layer 40 in the pocket 110 of the first mold 100 includes a method in which an adhesive layer is formed on a product formed by block machining or molding and the adhesive layer is disposed in the pocket 110 such that the adhesive layer formation surface is exposed. In the case of a molded material with the adhesive layer formed, the molded material may have a sheet shape. In the case of the impact absorbing layer 40 made of 2) the hot melt material, examples of the method include a potting method, a method for disposing a sheet-like material in the pocket 110, and a Low Pressure Molding method. In addition, a recessed portion may be provided on the side of the speaker 33 of the impact absorbing layer 40 so as to mate with the bottom surface of the speaker 33. In this case, when the electronic component mounting film 30 is set, a gap is less likely to be formed between the speaker 33 and the impact absorbing layer 40.

Figure 8:
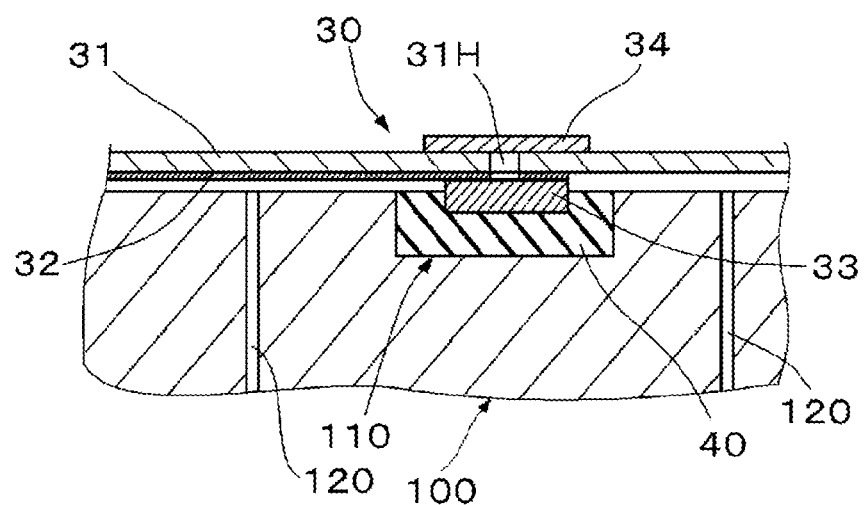
FIG. 8 is a partially enlarged cross-sectional view illustrating another example of a state in which the electronic component mounting film is set in the first mold (second embodiment).
Figure 9:
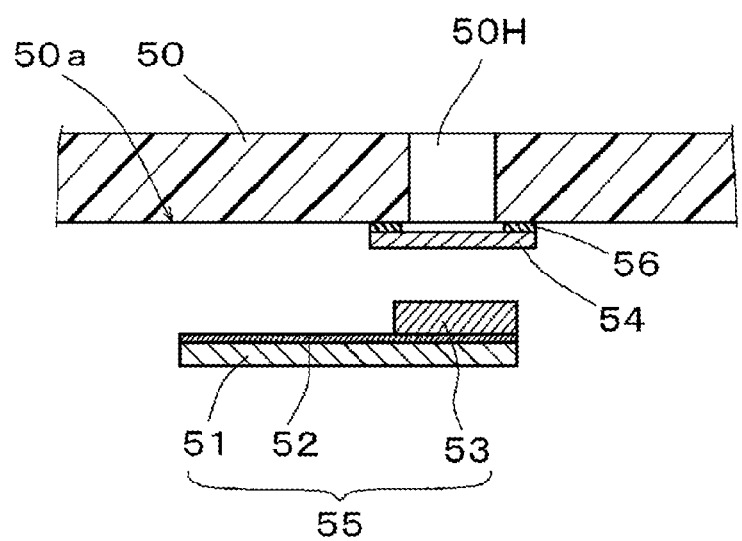
FIG. 9 is a partially enlarged cross-sectional view illustrating an example of arrangement of a housing and an electronic component of the related art.

Thereafter, as illustrated in FIG. 8, the electronic component mounting film 30 is set in the first mold 100 provided with the impact absorbing layer 40. At this time, similarly to the first embodiment, the speaker 33 is accommodated in the pocket 110 so as to fill the pocket 110 of the first mold 100 together with the impact absorbing layer 40. That is, the inside of the pocket 110 is gapless.

In the example illustrated in FIG. 8, the portion of the electronic component mounting film 30 not covered with the impact absorbing layer 40 slightly floats from the first mold 100 due to the thickness of the impact absorbing layer 40, but may be in close contact with the first mold 100. In any case, when the impact absorbing layer 40 is made of the material having the cushioning property, the electronic component mounting film 30 is sucked and fixed before mold clamping by vacuum suction with the plurality of suction holes 120 provided in the surface facing the electronic component mounting film 30 of the first mold 100. Therefore, even when the electronic component mounting film 30 slightly floats from the first mold 100, the electronic component mounting film 30 is in close contact with the first mold 100 by compression of the impact absorbing layer 40. Also in the case where the impact absorbing layer 40 is made of the hot melt material, even when the electronic component mounting film 30 slightly floats from the first mold 100, due to softening of the impact absorbing layer 40 during injection of the molten resin 300, the electronic component mounting film 30 is in close contact with the first mold 100 by compression of the impact absorbing layer 40.

A manufacturing process after mold clamping can be configured in the same manner as the manufacturing process (see FIG. 6) of the resin housing having the electronic component 10 described in the first embodiment.

In addition, each modified example described in the first embodiment can also be applied to the second embodiment.

Third Embodiment

Next, a method for manufacturing the resin housing having the electronic component according to the third embodiment of the present invention will be described with reference to FIGS. 12 and 13. The method for manufacturing the resin housing having the electronic component according to the third embodiment differs from the methods for manufacturing the resin housing having the electronic component according to the first and second embodiments in that the impact absorbing layer 40 is provided in the pocket 110 of the first mold 100 simultaneously with the electronic component mounting film 30 being set in the first mold 100.

Figure 12:
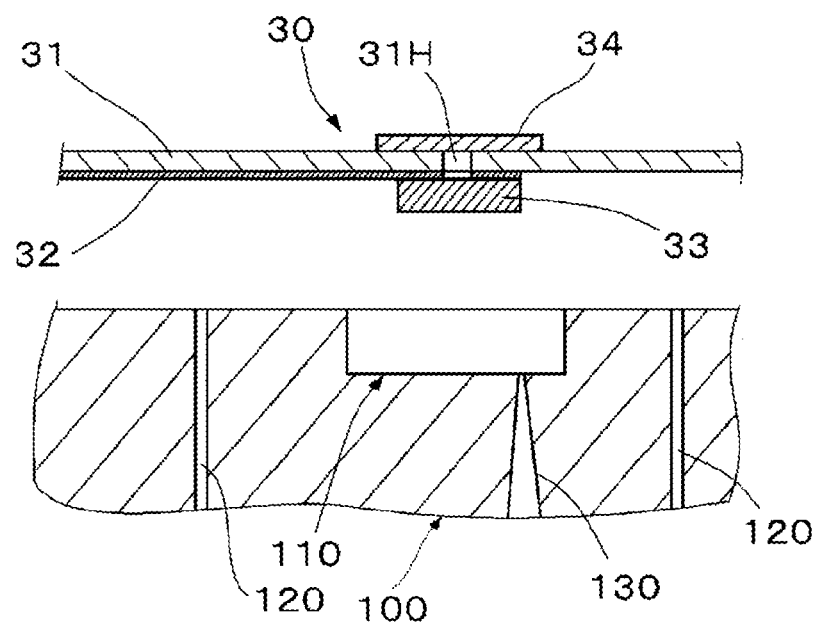
FIG. 12 is a partially enlarged cross-sectional view illustrating another example of a state before the electronic component mounting film is set in the first mold (third embodiment).

In the third embodiment, as illustrated in FIG. 12, when the electronic component mounting film 30 is inserted between the first mold 100 and the second mold 200 (not illustrated), the speaker 33 or the periphery of the speaker 33 is not covered with the impact absorbing layer 40.

Meanwhile, at this stage, the impact absorbing layer 40 is not provided in the pocket 110 of the first mold 100.

Figure 13:
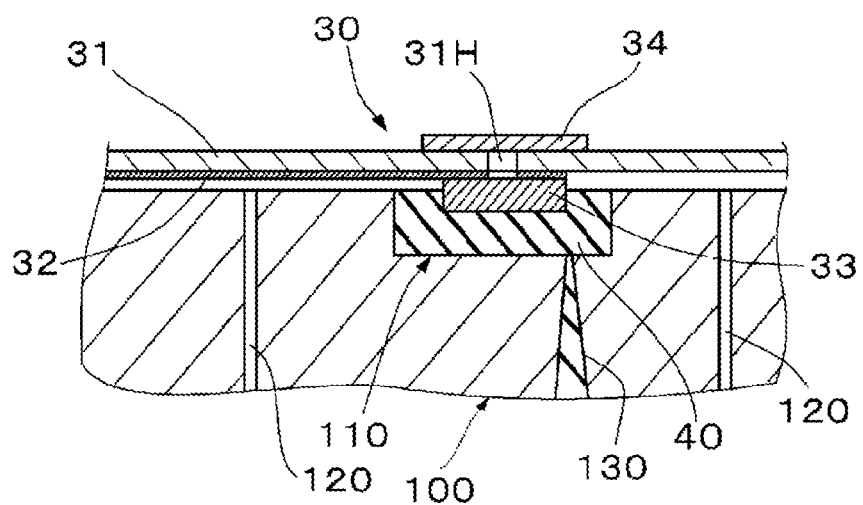
FIG. 13 is a partially enlarged cross-sectional view illustrating another example of a state in which the electronic component mounting film is set in the first mold (third embodiment).

Thereafter, as illustrated in FIG. 13, simultaneously with the electronic component mounting film 30 being set in the first mold 100, the impact absorbing layer 40 is provided in the pocket 110 of the first mold 100. At this time, similarly to the first embodiment, the speaker 33 is accommodated in the pocket 110 so as to fill the pocket 110 of the first mold 100 together with the impact absorbing layer 40. That is, the inside of the pocket 110 is gapless.

In the third embodiment, as illustrated in FIG. 13, the method for forming the impact absorbing layer 40 in the pocket 110 of the first mold 100 includes a method of providing an injection port 130 in the pocket 110 of the first mold 100 and injecting 1) the above-described material having excellent heat resistance and cushioning property from the injection port 130.

In the example illustrated in FIG. 13, the portion of the electronic component mounting film 30 not covered with the impact absorbing layer 40 slightly floats from the first mold 100 due to injection of the material constituting the impact absorbing layer 40, but may be in close contact with the first mold 100. In any case, when the impact absorbing layer 40 is made of the material having the cushioning property, the electronic component mounting film 30 is sucked and fixed before mold clamping by vacuum suction with the plurality of suction holes 120 provided in the surface facing the electronic component mounting film 30 of the first mold 100. Therefore, even when the electronic component mounting film 30 slightly floats from the first mold 100, the electronic component mounting film 30 is in close contact with the first mold 100 by compression of the impact absorbing layer 40. Also in the case where the impact absorbing layer 40 is made of the hot melt material, even when the electronic component mounting film 30 slightly floats from the first mold 100, due to softening of the impact absorbing layer 40 during injection of the molten resin 300, the electronic component mounting film 30 is in close contact with the first mold 100 by compression of the impact absorbing layer 40.

A manufacturing process after mold clamping can be configured in the same manner as the manufacturing process (see FIG. 6) of the resin housing having the electronic component 10 described in the first embodiment.

In addition, each modified example described in the first embodiment can also be applied to the third embodiment.

Although the embodiments of the present invention have been described above, the present invention is not limited to the embodiments, and various changes can be made without departing from the gist of the invention. In particular, the plurality of embodiments and modified examples described herein can be combined randomly with one another as necessary.

REFERENCE SIGNS LIST

10 Resin housing having an electronic component
20B, 20C, 50 Housing
50a Inner surface
50H Speaker hole
30 Electronic component mounting film
31 Base film
31H Through-hole
32, 52 Circuit pattern layer
33, 53 Speaker (example of the electronic component)
34, 54 Mesh member
40 Impact absorbing layer
51 Substrate
55 Electronic component mounting substrate
56 Adhesive
60 Smartwatch
65 Display panel
100 First mold
110 Pocket
120 Suction hole
130 Injection port
200 Second mold
210 Pin
250 Cavity
300 Molten resin

The invention claimed is:

1. A resin housing having an electronic component, comprising:
a housing made of resin;
an electronic component mounting film that includes a base film, a circuit pattern layer, and an electronic component, the base film being disposed along an inner surface of the housing, the circuit pattern layer being formed on at least a surface opposite to a side of the housing of the base film, the electronic component being connected to the circuit pattern layer and mounted on a surface opposite to the side of the housing of the base film, the electronic component mounting film being integrated with the housing; and
an impact absorbing layer that covers the electronic component of the electronic component mounting film and a periphery of the electronic component, wherein
the circuit pattern layer of the electronic component mounting film is not bent around a portion on which the electronic component is mounted.

2. The resin housing having the electronic component according to claim 1, wherein
the impact absorbing layer is made of a material having properties of a heat-resistant temperature of 80° C. or higher and a rebound resilience indicative of a cushioning property from 15 to 70%.

3. The resin housing having the electronic component according to claim 2, wherein
the material having the properties is any one of a soft polyurethane foam, a silicone resin, and a urethane rubber.

4. The resin housing having the electronic component according to claim 1, wherein
the impact absorbing layer is made of any one of a polyolefin-based hot melt, a polyurethane-based hot melt, and a polyamide-based hot melt.

5. The housing having the electronic component according to claim 1, further comprising an adhesive layer interposed between the electronic component mounting film and the housing so that the electronic component mounting film is indirectly integrated with the housing.

6. The housing having the electronic component according to claim 1, wherein the electronic component mounting film is integrated with the housing except for a part thereof using as a flexible printed circuit (FPC).

7. The housing having the electronic component according to claim 1, the circuit pattern layer is covered with a cover film except for a region for mounting the electronic component.

8. A method for manufacturing a resin housing having an electronic component, comprising:
preparing an electronic component mounting film that includes a base film, a circuit pattern layer formed on at least one surface of the base film, and an electronic component being connected to the circuit pattern layer and mounted on the base film;
setting the electronic component mounting film in a first mold such that a surface of the electronic component mounting film on which the electronic component is mounted faces the first mold and the electronic component fills a pocket of the first mold together with an impact absorbing layer that covers the electronic component and a periphery of the electronic component;
clamping the first mold and a second mold to form a cavity between the first mold with the electronic component mounting film and the second mold; and
injecting a molten resin into the cavity to mold a housing, and integrating the electronic component mounting film along an inner surface of the housing in a state where the circuit pattern layer of the electronic component mounting film is not bent around a portion on which the electronic component is mounted.

9. The method for manufacturing the resin housing having the electronic component according to claim 8, wherein
after the electronic component of the electronic component mounting film and a periphery of the electronic component are covered with the impact absorbing layer, the electronic component mounting film is set in the first mold such that the electronic component and the impact absorbing layer fill the pocket of the first mold.

10. The method for manufacturing the resin housing having the electronic component according to claim 8, wherein
after the impact absorbing layer is provided in the pocket of the first mold in advance, the electronic component mounting film is set in the first mold such that the electronic component and the impact absorbing layer fill the pocket of the first mold.

11. The method for manufacturing the resin housing having the electronic component according to claim 8, wherein
the impact absorbing layer is provided in the pocket of the first mold such that the electronic component and the impact absorbing layer fill the pocket of the first mold simultaneously with setting the electronic component mounting film in the first mold.

12. The method for manufacturing the resin housing having the electronic component according to claim 8, wherein
the impact absorbing layer is made of a material having properties of a heat-resistant temperature of 80° C. or higher and a rebound resilience indicative of a cushioning property from 15 to 70%.

13. The method for manufacturing the resin housing having the electronic component according to claim 12, wherein the material having the properties is any one of a soft polyurethane foam, a silicone resin, and a urethane rubber.

14. The method for manufacturing the resin housing having the electronic component according to claim 8, wherein the impact absorbing layer is made of any one of a polyolefin-based hot melt, a polyurethane-based hot melt, and a polyamide-based hot melt.

15. A method for manufacturing a resin housing having an electronic component, comprising:

preparing an electronic component mounting film that includes a base film, a circuit pattern layer formed on at least one surface of the base film, and an electronic component being connected to the circuit pattern layer and mounted on the base film;

placing an impact absorbing layer in a pocket of a first mold, wherein the pocket is for receiving the electronic component mounting film;

setting the electronic component mounting film in the pocket of the first mold such that a surface on which the electronic component is mounted faces and touches the impact absorbing layer;

clamping the first mold and a second mold to form a cavity between the first mold with the electronic component mounting film and the second mold; and injecting a molten resin into the cavity to mold a housing, and integrating the electronic component mounting film along an inner surface of the housing in a state where the circuit pattern layer of the electronic component mounting film is not bent around a portion on which the electronic component is mounted.

16. The method for manufacturing the resin housing having the electronic component according to claim 15, wherein the impact absorbing layer covers the electronic component and a periphery of the electronic component.

17. The method for manufacturing the resin housing having the electronic component according to claim 15, wherein the impact absorbing layer covers only the electronic component.

18. The method for manufacturing the resin housing having the electronic component according to claim 17, further comprising placing a cover film on the base film except for a region where the electronic component is mounted.

* * * * *